Nov. 18, 1969 J. N. CASTELLI 3,479,609
ATTENUATION CIRCUIT USING A TUNED AMPLIFIER WHOSE
Q IS VARIED BY SHUNTING RESISTORS
Filed June 13, 1966

Joseph N. Castelli,
INVENTOR.
Harry M. Saragovitz
BY Edward J. Kelly
Herbert Berl
Aubrey J. Dunn

United States Patent Office 3,479,609
Patented Nov. 18, 1969

3,479,609

ATTENUATION CIRCUIT USING A TUNED AMPLIFIER WHOSE Q IS VARIED BY SHUNTING RESISTORS

Joseph N. Castelli, Hull, Mass., assignor, by mesne assignments, to the United States of America as represented by the Secretary of the Army Filed June 13, 1966, Ser. No. 557,863
Int. Cl. H03f 3/04, 3/68
U.S. Cl. 330—21 4 Claims

ABSTRACT OF THE DISCLOSURE

A plurality of resistors are each respectively connected in a series arrangement with respective ones of a plurality of transistors. Each series arrangement is connected across a tuned circuit portion of a tuned amplifier. When ones of the transistors are conducting, the series resistors decrease the Q of the tuned circuit, causing a corresponding decrease in amplification, or increase in attenuation.

There are many possible applications for stepwise controlled attenuation circuits. One of the most obvious is in a cathode-ray oscilloscope, whereby the vertical scale may be varied. Another use could be for testing of electronic equipment, or calibration of the same. The instant invention provides a stepwise controllable attenuation circuit which is usable with radio frequencies, and which does not introduce undesirable phase shifts to the said frequencies.

An object of the invention is to provide an improved stepwise electrical attenuator.

Another object is to provide an attenuator which does not introduce phase shifts to signals applied thereto.

These objects, and others which may be obvious from the following disclosure, may be obtained by the invention. The invention uses a tuned amplifier in which the Q of the tuned circuit of said amplifier may be varied. Such a variation in Q causes an inverse variation in the attenuation of the amplifier, that is, a decrease in Q causes an increase in attenuation.

The invention may be best understood by reference to the drawings, in which.

Figure 1:
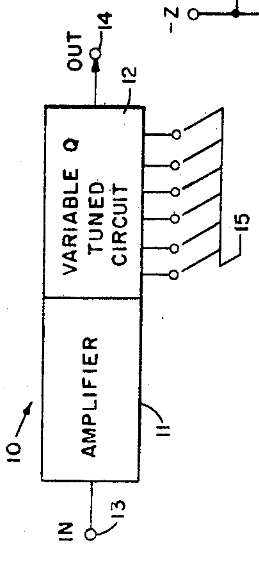
FIGURE 1 shows a block diagram of the invention.

Referring now to FIGURE 1, reference numeral 10 designates a tuned amplifier including an amplifier portion 11 and a tuned circuit portion 12. An input is applied to said amplifier at terminal 13, and an output is taken at terminal 14. Tuned circuit 12 includes means for varying its Q and such means are controlled through a plurality of terminals 15. Variations in the Q of circuit 12 cause inverse variations in the attenuation between terminals 13 and 14.

Figure 2:
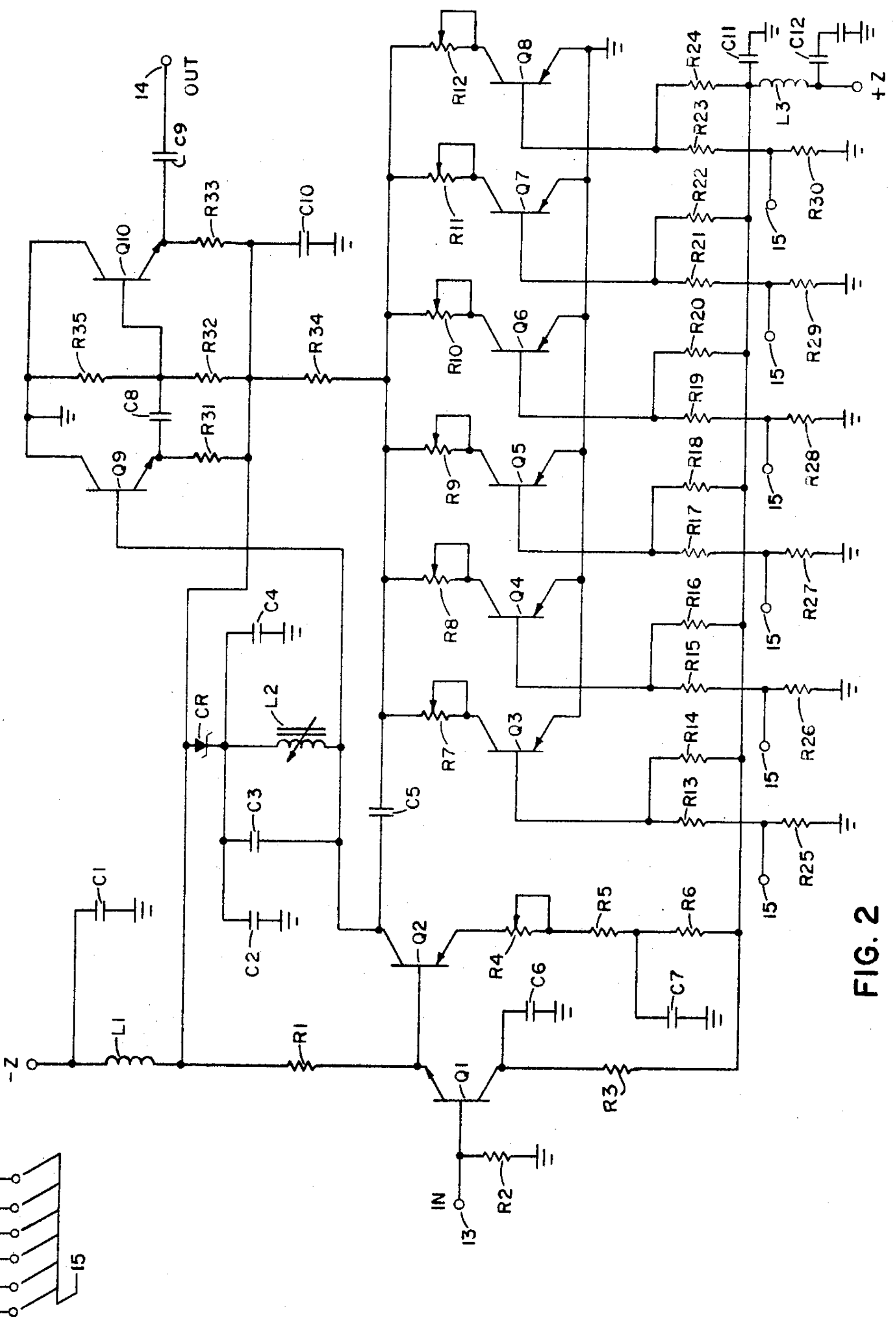
FIGURE 2 shows an exemplary specific embodiment of the invention, employing transistors as active circuit elements.

Reference may now be made to the exemplary specific circuit of FIGURE 2 in which numerals the same as those of FIGURE 1 are used for the input, output, and control terminals 13, 14, and 15, respectively. Connected to input terminal 13 of FIGURE 2 is transistor Q1, connected in an emitter follower configuration. Q1 is, in turn, connected to transistor Q2, which has in circuit therewith a tuned circuit consisting of capacitor C3 and variable inductor L2. Resistor R34 is a shunt resistor across this tuned circuit producing a high Q, low bandwidth response therefor. Transistor Q2 is of variable gain, the gain of which may be adjusted by adjustment of variable resistor R4. Tied to the collector of Q2 are load resistors R7 through R12 of transistors Q3 through Q8.

When a certain amount of attenuation is desired, one of the control lines 15 is energized (by means not shown) and its associated transistor (Q3 through Q8) saturates and places its collector resistor (R7 through R12) across the C3–L2 tuned circuit and thereby lowers the Q of said tuned circuit. The smaller the value of this collector resistor, the lower will be the value of Q of the tuned circuit.

The voltage peak-to-peak swing of the collector of Q2 will depend on the Q of the tuned circuit, and amplitude variation by variation of Q is obtained.

The collector resistances R7 through R12 are adjustable in order that the attenuation steps may be individually adjusted.

Transistors Q9 and Q10 are emitter followers which drive output terminal 14 with the voltage swing of the collector of Q2, and provide impedance matching.

The input voltage to terminal 13 may be, for example, 30 megacycles. Inductors L1 and L3 act as RF chokes for the C power supplies +Z and −Z, which may be + and −12 volts, respectively. Capacitors C1, C2, C4, C6, C7, C10, C11, and C12 are filter capacitors for various parts of the circuit, while capacitors C5, C8, and C9 are coupling capacitors between various portions of the circuit.

Resistors R1 and R3 are respectively the emitter and collector load resistors for Q1. Resistor R2 acts as an impedance matcher for an input to terminal 13. Resistors R5 and R6 are current limiting resistors for Q2. Resistors R14, R16, R18, R20, R22, and R24 are load resistors for their respective transistors Q3 through Q8. Resistors R13 and R25, R15 and R26, R17 and R27, R19 and R28, R21 and R29, and R23 and R30 provide voltage dividers for the control signals applied to terminals 15. Resistors R31, R32, R33, and R35 are bias and load resistors for transistors Q9 and Q10.

Zener diode CR acts as a voltage regulator for −Z.

Specific examples for the circuit components of FIGURE 2 are as follows:

| Component(s) | Value or number |
|---|---|
| Q1, Q9, Q10 | 2N706. |
| Q2 | 2N705. |
| Q3, Q4, Q5, Q6, Q7, Q8 | 2N1500 (Philco). |
| R1, R13, R15, R19, R21, R23 | 2000 ohms. |
| R2 | 75 ohms. |
| R3, R34 | 1500 ohms. |
| R4, R8 | 0–500 ohms adjustable. |
| R5 | 270 ohms. |
| R6, R31 | 510 ohms. |
| R7 | 0–100 ohms adjustable. |
| R9, R10, R11 | 0–1000 ohms adjustable. |
| R12 | 0–5000 ohms adjustable. |
| R14, R16, R18, R20, R22, R24 | 22,000 ohms. |
| R25, R26, R27, R28, R29, R30 | 220 ohms. |
| R32 | 8200 ohms. |
| R33 | 180 ohms. |
| R35 | 1000 ohms. |
| C1, C4, C10, C11, C12 | 1500 picofarads. |
| C2 | 2 microfarads. |
| C3 | 110 picofarads. |
| C5 | 680 picofarads. |
| C6, C9 | 0.01 microfarad. |
| C7 | 4700 picofarads. |
| C8 | 0.1 microfarad. |
| L1, L3 | 15 microhenrys. |
| L2 | 0.22 microhenry adjustable. |

While a specific embodiment of the invention has been shown and described, other embodiments may be obvious to one skilled in the art. For example, a vacuum tube type of circuit could be substituted for the transistor circuit as shown, and still fall within the scope of the invention. Obviously, other types of current controlling devices besides vacuum tubes and transistors might be employed to advantage. The component values and types above are merely exemplary, and other values and types could be substituted without departing from the spirit of the invention.

Since only resistive elements are employed to vary the Q of the tuned circuit of the amplifier of the invention, undesirable phase shifts would not be introduced, although such a variation in Q would cause changes in bandwidth of the inventive device.

Obviously, more than one of the transistors of the FIGURE 2 circuit could be energized at the same time to give further steps of attenuation.

I claim:

1. A variable attenuator including tuned amplifier means, and means for varying the Q of the tuned circuit of said tuned amplifier, said means for varying including plural parallel connected impedance means connectable to shunt said tuned circuit, and thereby to lower the Q of said tuned circuit, wherein each of said impedance means includes series connected current controlling means and resistive means.

2. The attenuator of claim 1 wherein said current controlling means is a transistor.

3. The attenuator of claim 2 wherein energization of said transistor provides a predetermined attenuation for said amplifier.

4. The attenuator of claim 1 wherein said amplifier includes first and second transistors connected in cascade, with input means connected to said first transistor, and with a tuned circuit connected to said second transistor, each of said current controlling means including a normally non-conducting transistor.

References Cited

UNITED STATES PATENTS

| | | | |
|---|---|---|---|
| 1,718,138 | 6/1929 | Grimditch | 334—40 X |
| 2,735,902 | 2/1956 | Vose | 330—145 X |
| 2,858,424 | 10/1958 | Stern et al. | 330—145 |
| 3,177,350 | 4/1965 | Abbott et al. | 330—144 X |
| 3,193,775 | 7/1965 | Herrero et al. | 334—40 X |
| 3,234,480 | 2/1966 | Maeda | 330—154 X |
| 3,369,173 | 2/1968 | Andrews | 333—81 X |
| 3,370,181 | 2/1968 | Sitomer | 333—81 X |

HERMAN KARL SAALBACH, Primary Examiner

W. H. PUNTER, Assistant Examiner

U.S. Cl. X.R.

307—241, 253; 328—170; 330—144; 333—81; 334—40; 378—103